(12) United States Patent
Cattin et al.

(10) Patent No.: US 9,354,282 B2
(45) Date of Patent: May 31, 2016

(54) METHOD AND DEVICE FOR COMPENSATION IN A MEASUREMENT OF A MAGNETIC FIELD, OBJECT-LOCALIZING METHOD AND SYSTEM, RECORDING MEDIUM FOR THESE METHODS

(75) Inventors: Viviane Cattin, Saint Egreve (FR); Malvina Billeres, Grenoble (FR)

(73) Assignee: Commissariat a l'Energie Atomique et aux energies alternatives, Paris (FR)

(*) Notice: Subject to any disclaimer, the term of this patent is extended or adjusted under 35 U.S.C. 154(b) by 1403 days.

(21) Appl. No.: 13/085,523

(22) Filed: Apr. 13, 2011

(65) Prior Publication Data

US 2011/0267046 A1 Nov. 3, 2011

(30) Foreign Application Priority Data

Apr. 14, 2010 (FR) .................................... 10 52836

(51) Int. Cl.
*G01R 33/00* (2006.01)
*G01R 33/025* (2006.01)

(52) U.S. Cl.
CPC .................... *G01R 33/025* (2013.01)

(58) Field of Classification Search
CPC ................................................... G01R 33/025
USPC ........................................ 702/150; 324/225
See application file for complete search history.

(56) References Cited

U.S. PATENT DOCUMENTS

| 5,134,369 | A | 7/1992 | Lo et al. |
| 5,182,514 | A | 1/1993 | Rice, Jr. |
| 6,528,989 | B1 * | 3/2003 | Hansen .................... 324/207.12 |
| 7,321,228 | B2 * | 1/2008 | Govari .................... 324/207.17 |
| 2003/0135112 | A1 * | 7/2003 | Ritter et al. .................... 600/424 |
| 2008/0309327 | A1 * | 12/2008 | Holmstrom .............. 324/207.21 |
| 2011/0153233 | A1 * | 6/2011 | Grenet et al. .................... 702/57 |

FOREIGN PATENT DOCUMENTS

| EP | 1502544 | | 9/2007 | |
| WO | 2009/138441 | A1 | 11/2009 | |
| WO | WO2009138441 | * | 11/2009 | ............. G01C 17/38 |

OTHER PUBLICATIONS

John D. Jackson, Classical Electrodynamics, 1925, John Willey & Son.*
English language abstract for WO 2009138441.*
Lindell et al., "Exact Image Theory for Sommerfeld Half-Space Problem, Part III: General Formulation," IEEE Transactions on Antennas and Propagation, Bol. AP-32, No. 10, pp. 1027-1032 (Oct. 1984).
Lindell et al., "Exact Image Theory for Sommerfeld Half-Space Problem, Part I: Vertical Magnetic Dipole," IEEE Transactions on Antennas and Propagation, vol. AP-32, No. 2, pp. 126-133 (Feb. 1984).

* cited by examiner

*Primary Examiner* — Michael Nghiem
*Assistant Examiner* — Peter Ngo
(74) *Attorney, Agent, or Firm* — Occhiuti & Rohlicek LLP

(57) ABSTRACT

This method of compensation in the measurement of a magnetic field comprises: the determining of a position and of a magnetic moment of an image of the source situated on the other side of the magnetic disturber using one or more measurements of the emitted magnetic field, performed by at least one magnetic sensor whose position and orientation relatively to the source are known, and the subtraction of the magnetic field emitted by this image from the measurement of the magnetic field made by the sensor in the presence of the magnetic disturber to obtain compensation in this measurement.

11 Claims, 2 Drawing Sheets

METHOD AND DEVICE FOR COMPENSATION IN A MEASUREMENT OF A MAGNETIC FIELD, OBJECT-LOCALIZING METHOD AND SYSTEM, RECORDING MEDIUM FOR THESE METHODS

CROSS REFERENCE TO RELATED APPLICATIONS

This application claims the benefit of the Apr, 14, 2010 priority date of French application 1052836. The contents of the foregoing application are incorporated herein by reference.

BACKGROUND OF THE INVENTION

1. Field of the Invention

The invention pertains to a method and a device for compensation in a measurement of a magnetic field. The invention also pertains to a method and a system for localizing an object as well as an information-recording medium, to implement these methods.

2. Prior Art

The present filing party knows a method for compensation in a measurement of a magnetic field comprising the emission, in the presence of a magnetic disturber, of a magnetic field by a uniaxial source situated on one side of the magnetic disturber, the magnetic moment of this source being known.

A magnetic disturber is defined herein as any object that degrades or deforms the field lines of a magnetic field emitted in proximity. For example, the disturber may be a conductive part. In this case, the degradation of the magnetic field lines is caused by the appearance of eddy currents in the conductive part. The conductive part may be for example a metal part. The disturber may also be a magnetic part such as a paramagnetic or ferromagnetic part. A part is considered to be magnetic if its relative permeability is different from 1.

Compensation in a measurement of a magnetic field is done by correcting this measurement to make it approach the measurement that would be obtained in the absence of the magnetic disturber.

A uniaxial magnetic field source is a source that preferably emits the magnetic field along only one axis. For example, a coil whose turns are wound about a same axis is a uniaxial magnetic field source and the preferred emission axis coincides with the winding axis of the turns.

A triaxial or three-axis magnetic field source emits a magnetic field along three emission axes that are mutually non-collinear. For example, such a source or emitter is formed by several uniaxial magnetic field sources that are aligned respectively on each of the axes of emission.

Similarly, an at least triaxial source is a source that emits magnetic fields along three or more non-collinear axes.

A triaxial magnetic field sensor is also defined as a sensor capable of measuring the direction of the magnetic field. Typically, to this effect, these sensors measure the amplitude of the projection of the magnetic field on three mutually non-collinear axes of measurement. Thus, these sensors can be used to measure the direction of the magnetic field and, generally, also the amplitude of this magnetic field.

Methods of compensation in the measurement of the magnetic field are used particularly in methods for localizing an object by means of a magnetic system. Indeed, if the measured magnetic field used to localize an object is disturbed, then the localizing of the object is erroneous. This may have particularly deleterious consequences when the localizing method is used in medicine to locate a probe or a catheter within the human body. Indeed, for such applications, it is very important that the localization of the probe should be reliable. Now, in medicine, there are many magnetic disturbers that are liable to falsify the localization. For example, the magnetic disturber may be an operation table, the metal frame of another apparatus placed near the patient, etc.

SUMMARY OF THE INVENTION

Several methods have already been proposed to provide compensation in disturbed measurements of the magnetic field. These methods make use of complex calculations or calibration of the environment.

The invention seeks to overcome this problem by compensating simply for the presence of a magnetic disturber.

An object of the invention therefore is a method of compensation comprising:

the determining of a position and of a magnetic moment of an image of the source situated on the other side of the magnetic disturber using one or more measurements of the emitted magnetic field, performed by at least one magnetic sensor whose position and orientation relatively to the source are known, the position and the magnetic moment of the image minimizing the following relationship for each sensor:

$\vec{B}_{me} - (\vec{B}_S + \vec{B}_I)$ where:

$\vec{B}_{me}$ is the magnetic field measured by the sensor in the presence of the magnetic disturber, $\vec{B}_S$ is the magnetic field measured by the sensor in the presence of the of the magnetic disturber, and $\vec{B}_I$ is the fictitious magnetic field emitted by the image that would be measured by the sensor in the absence of the magnetic disturber, and the subtraction of the magnetic field emitted by this image from the measurement of the magnetic field made by the sensor in the presence of the magnetic disturber to obtain compensation in this measurement.

The above method modelizes the disturbances of the magnetic field caused by the magnetic disturber as a magnetic field emitted by the image of the source relatively to this magnetic disturber. The compensation in any measurement of the magnetic field emitted by this source is then very simple since it is enough to subtract the field emitted by the image of this source from the measured magnetic field. Furthermore, in a distant field, the image of the source is seen as a magnetic dipole for which the equation of the radiated field is known and has low mathematical complexity. This method is therefore particularly simple to implement and use.

Furthermore, the above method works whatever the number of measurement axes disturbed by the magnetic disturber. Thus, contrary in other methods, it does not require the existence of at least one non-disturbed measurement along at least one measurement axis.

Finally, this method works whatever the nature of the magnetic disturber, i.e. the magnetic disturber can equally well be a conductive part or a magnetic part or both at the same time.

The embodiments of this compensation method may comprise one or more of the following characteristics:

during the determining of the position and of the magnetic moment of the image, at least one additional relationship derived from image theory in electromagnetism is used, where the additional relationships chosen are chosen from the following set:

$$M_i = M_S\left(\frac{1-\mu_r}{1+\mu_r}\right)\left(\frac{1-\sigma}{1+\sigma}\right) \text{ or}$$

$$M_i = M_S\left(\frac{1-\mu_r}{1+\mu_r}\right) \text{ or}$$

$$M_i = M_S\left(\frac{1-\sigma}{1+\sigma}\right),$$

where:
$M_i$ and $M_S$ are magnetic moments respectively of the image and of the source, and
$\sigma$ and $\mu_r$ are respectively the conductivity and relative permeability of the magnetic disturber,
the shortest distance between the source and the magnetic disturber is equal to the shortest distance between the image of this source and the same magnetic disturber, and
the normal component of the magnetic field at the crossing of one face of the magnetic disturber is kept on either side of this face;

the method comprises:
the determining of the position and of the magnetic moment of an image of the source solely from the measurements of the magnetic field, in quadrature relatively to the magnetic field emitted by this source, performed by the sensor or sensors for which the position and orientation relatively to the source are known, and
the determining of the position and of the moment of an other image of the same source solely from the measurements of the magnetic field, in phase with the magnetic field emitted by this source, performed by the sensor or sensors for which the position and orientation relatively to the source are known;

the method comprises the computation of the effective modulus of the magnetic field from measurements of the magnetic field in phase and in quadrature relatively to the magnetic field emitted by the source performed by the sensor or sensors whose position and orientation relatively to the source are known and the determining of the position and of the magnetic moment of at least one image of the source from the modulus of the magnetic field;

the method comprises:
the determining (64) of the position and magnetic moment of several images of the same source from the same measurements of the magnetic field performed by several sensors for which the positions and orientations are known relatively to the source, and
the subtraction of the magnetic field emitted by these images from the measurement of the magnetic field performed by a sensor in the presence of the magnetic disturber to compensate for this measurement;
each image of the source being modeled as being a magnetic dipole.

These embodiments of the compensation method furthermore have the following advantages:
using an additional relationship derived from image theory in electromagnetism restricts the number of sensors or simplifies the sensors needed to determine the position and the magnetic moment of the image of the source;
using two images coming respectively from the phase and phase quadrature measurements improves the compensation in the measurements of the magnetic field when these measurements are disturbed by a magnetic disturber that is both conductive and permeable,
using the effective modulus of the magnetic field also improves the compensation in the measurements of the magnetic field when they are disturbed by a magnetic disturber that is both conductive and permeable;
using several images of the source improves the compensation in the measurement when the magnetic disturber moves away from the theoretical conditions enabling the use of image theory in electromagnetism;
modelizing the image of the source as a magnetic dipole simplifies the computations.

An object of the invention is also a method for localizing an object, the method comprising:
the emission, in the presence of a magnetic disturber, of a magnetic field by a uniaxial source situated on one side of the magnetic disturber, the magnetic moment of this source being known,
the measurement of the magnetic field emitted by a fixed sensor without any degree of freedom for the object,
the localization of the object relatively to the source through the measurement of this sensor, and
during the localization, achieving compensation in the measurement of the sensor by means of the above compensation method.

The embodiments of this localization method may comprise the following characteristics:
the localization comprises the determining of the distances from the sensor to be localized to its source and to its image or images.

An object of the invention is also an information-recording medium comprising instructions for executing one of the above methods when these instructions are executed by an electronic computer.

An object of the invention is also a device for compensation in the measurement of a magnetic field, this device comprising:
a uniaxial source situated on one side of a magnetic disturber, this source being capable of emitting a magnetic field in the presence of this magnetic disturber, the magnetic moment of this source being known,
at least one sensor of the magnetic field for which the position and the orientation relatively to the magnetic source are known,
a compensator capable of:
determining the position and the magnetic moment of an image of the source situated on the other side of the magnetic disturber through one or more measurements of the magnetic field emitted by the source performed by the sensor or sensors, the position of the magnetic moment of the image minimizing the following relationship for each sensor: $\vec{B}_{me}-(\vec{B}_S+\vec{B}_I)$, where:

$\vec{B}_{me}$ is the magnetic field measured by the sensor in the presence of the magnetic disturber, $\vec{B}_S$ is the magnetic field that would be measured by the sensor in the absence of the magnetic disturber, and $\vec{B}_I$ is the fictitious magnetic field emitted by the image that would be measured by the sensor in the absence of the magnetic disturber, and
subtracting the magnetic field emitted by this image from the measurement of the magnetic field made by the sensor to compensate in this measurement.

Finally, an object of the invention is also a system of localization comprising:
at least one uniaxial source situated on one side of a magnetic disturber, this source being capable of emitting a magnetic field in the presence of this magnetic disturber, the magnetic moment of this source being known, at least one sensor of the magnetic field emitted by the source, this sensor being fixed without any degree of freedom to the object to be localized, and a module for localizing the position of the sensor relatively to the source through the measurement of the sensor, the above device for compensating in the measurement used by the localization module

BRIEF DESCRIPTION OF THE DRAWINGS

The invention will be understood more clearly from the following description given purely by way of a non-restrictive example and made with reference to the drawings of which.

DETAILED DESCRIPTION OF THE INVENTION

In these figures, the same references are used to designate the same elements.

Here below in this description, the characteristics and functions well known to those skilled in the art are not described in detail.

Figure 1:
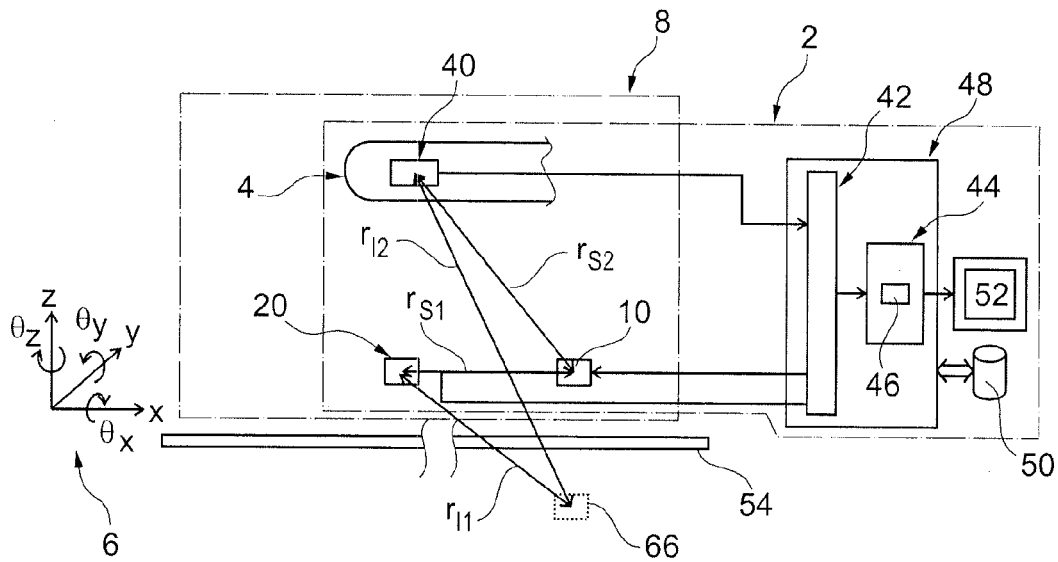
FIG. 1 is a schematic illustration of a first embodiment of a system for localizing an object.

FIG. 1 represents a system 2 for localizing an object 4 in a referential system 6. The object 4 is for example a probe or a catheter introduced into a human body 8. The object 4 is mobile in the referential system 6.

The referential system 6 is a fixed referential system having three orthogonal axes X, Y and Z.

The localizing of the object 4 in the referential system 6 consists in finding its x, y, z position and its $\theta_x$, $\theta_y$ and $\theta_z$ orientation. The angles $\theta_x$, $\theta_y$ and $\theta_z$ represent the orientation of the object 4 respectively relatively to the axes X, Y and Z.

The system 2 comprises a magnetic field source 10. The position of the source 10 is known in the referential system 6. For example, the source 10 is fixed in this referential system 6. This source 10 herein is a uniaxial source which emits a magnetic field along an axis 12 (FIG. 2) parallel to the axis Z. For example, the source 10 consists of a single coil 14 (FIG. 2) wound about the axis 12. Here, this coil is divided into two identical groups of turns distributed symmetrically on either side of a point $O_s$ along the winding axis. Each group of turns is coiled in the same sense along the winding axis. The greatest dimension L of this source 10 is therefore herein equal to the length of the coil 14. For example, the distance L is equal to 15 mm.

The magnetic field generated by this source 10 at a point spaced out from the source 10 by a distance greater than 2 L and preferably greater than 3 L or 4 L may be considered to be emitted by a magnetic field point source coinciding with the point $O_s$. The point $O_s$ is the center of the source 10.

The system 2 also has a sensor 20 whose position is known relatively to the source 10. For example, the position of the sensor 20 is fixed. Typically, for this purpose, the source 10 and the sensor 20 are fixedly joined to a same rigid substrate.

The distance between the source 10 and the sensor 20 is greater than 2 L and preferably greater than 3 L or 4 L so that the magnetic field generated by the source 10 at the sensor 20 can be considered to be generated by a dipolar source.

Figure 3:
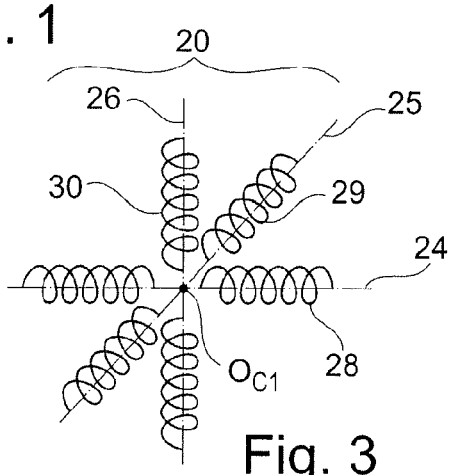
FIG. 3 is a schematic illustration of a triaxial magnetic field sensor used in the system of FIG. 1.

The sensor 20 is for example a triaxial sensor represented in greater detail in FIG. 3. This sensor measures the magnetic field received along three non-collinear axes 24 to 26. Here, these measurement axes 24 to 26 are mutually orthogonal. To this end, the sensor 20 incorporates for example three uniaxial transducers 20 to 30. Each of these transducers has a direction of measurement along which its sensitivity to the magnetic field is the maximum. Here, the directions of measurements of the transducers 28 to 30 coincide respectively with the axes 24 to 26.

For example, the transducers 28 to 30 are coils wound respectively about the axes 24 to 26.

Figure 2:
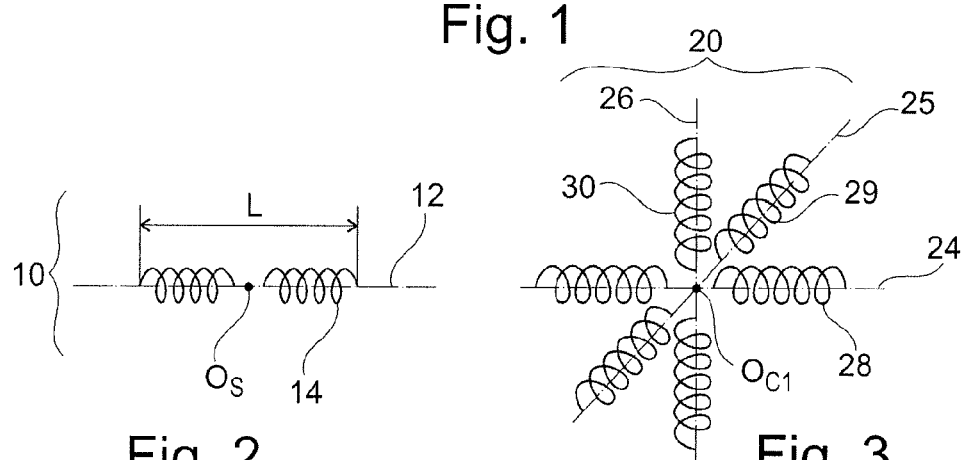
FIG. 2 is a schematic illustration of a uniaxial source of a magnetic field used in the system of FIG. 1.

By way of an illustration, in a manner similar to that of the description made with reference to FIG. 2, each of the coils 28 to 30 is divided into two identical groups of turns distributed symmetrically on either side of a point $O_{c1}$ corresponding to the intersection of the axes 24 to 26. The magnetic field measured by the sensor 20 is therefore the magnetic field existing at the point $O_{c1}$. The point $O_{c1}$ is the center of the sensor 20.

The system 2 also has another magnetic field sensor 40 fixed to the object 4 without any degree of freedom. This sensor 40 is for example a triaxial sensor whose axes of measurement are linked to the object 4. This sensor 40 is herein identical to the sensor 20.

The sensors 20 and 40 and the source 10 are connected to a processing unit 42. This unit 42 acquires the measurements made by the sensors 20 and 40 and also supplies the source 10 in order to emit the magnetic field. Typically, the unit 42 supplies the source 10 with AC current to generate the magnetic field.

More specifically, on each measurement axis of each sensor, the unit 42 measures the amplitude of the components of the magnetic field in phase quadrature and in phase with the magnetic field emitted. To this end, the unit 42 is a synchronous detector. One example of such a synchronous detector is described with reference to FIG. 16 of the U.S. Pat. No. 6,528,989. The unit 42 shall therefore not be described in greater detail herein.

The unit 42 is connected to a module 44 for localizing the object 4 in the referential system 6. Typically, this module 44 determines the position and orientation of the object 4 by resolving a system of equations. This system of equations is obtained by modeling the magnetic interactions between the uniaxial source and the different uniaxial transducers forming the sensors without taking account of the presence of a magnetic disturber. In this system of equations, the position x, y and z and the orientation $\theta_x$, $\theta_y$ and $\theta_z$ of the object 4 are unknowns while the values of the other parameters are obtained from measurements made by the sensor 40. Further information on such systems of equations can be found for example in the patent application EP 1 502 544.

Here, preferably, this system of equations is written in the form of a Kalman filter.

In this embodiment, the module 44 comprises a compensator 46 for measurements of the magnetic field. This compensator 46 corrects the measurements of the magnetic field in order to reduce the consequences of the disturbances of these measurements caused by a magnetic disturber. The measurements thus compensated are then used to localize the object 4.

For example, the unit 42 takes the form of an electronic board while the module 44 takes the form of a software module. The system 2 therefore includes a programmable electronic computer 48 incorporating the unit 42 and capable of executing instructions recorded on an information-recording medium. The computer 48 is connected to a memory 50 containing the instructions for the execution of the method of FIG. 4 when they are executed by the computer 48. The computer 48 is also connected to a man-machine interface 52. For example, the man-machine interface has a screen on which the position of the object 4 in the reference system 6 is presented.

The source 10, the sensor 20 and the compensator 46 form a compensation device for measuring the sensor 40.

Finally, in FIG. 1, a magnetic disturber 54 has been shown. This disturber 54 is fixed relatively to the source 10. In the present case, it has a horizontal plane face, i.e. a face parallel to the plane defined by the axes X and Y of the reference system 6. More specifically, this disturber 54 herein takes the form of a rectangular plate with a length $L_x$ and a width $I_y$. These dimensions $L_x$ and $I_y$ are great enough for the distance $r_{s2}$ between the source 10 and the sensor 40 to be smaller than a quarter of the smallest of these dimensions $L_x$ and $I_y$. Thus, the disturber 40 is considered to be an infinite plane relatively to the measurements made by the sensor 40 and the sensor 20.

Furthermore, in this first embodiment, it is assumed that the disturber 54 is very highly conductive, i.e. that it has conductivity greater than 10 S·m$^{-1}$ and, preferably, greater than 40 or 50 S·m$^{-1}$. For example, the disturber 54 is an aluminum plate. Here, this disturber 54 is an operation table.

Figure 4:
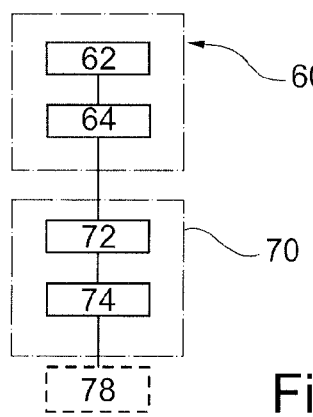
FIG. 4 is a flowchart of a method for localizing an object and for compensation in disturbed measurements.

The working of the system 2 shall now be described with reference to the method of FIG. 4.

The method starts with a calibration phase 60. During this phase 60 and more specifically during a step 62, the source 10 emits a magnetic field and the sensor 20 measures this magnetic field.

Then, these measurements are acquired by the unit 42 and transmitted to the compensator 46. The compensator 46 then goes to a step 64 for determining the position and the magnetic moment of an image 66 of the source 10 relatively to the disturber 54.

An image of a uniaxial source is a theoretical source of a fictitious magnetic field situated on the other side of the magnetic disturber. The component of the fictitious magnetic field that is normal to the face of the disturber is kept when passing through this face. The term "kept" means that the normal component is identical on both sides of the face crossed. Furthermore, the position and the intensity of the magnetic moment of the image are such that they minimize the following relationship:

$$B_{me}(B_s+B_I), \text{ where:}$$

$B_{me}$ is the magnetic moment measured by the sensor 20 in the presence of the magnetic disturber 54, $B_S$ is the magnetic field emitted by the source 10 measurable by the sensor 20 in the absence of the magnetic disturber 54, and $B_I$ is the fictitious magnetic field emitted by the image 62 measured by the sensor 20 in the absence of the magnetic disturber.

During this step 64, using the equations of electromagnetism, the position and the moment $M_I$ of the image 66 are determined. To simplify the computations, the invention herein also uses dipole approximation. Thus, the magnetic field, produced by the source 10 and its image 66 in the absence of the disturber 54 and measured by the sensor 20, is given by the following relationship:

$$\vec{B}\_mo1 = \frac{\mu_0}{4\pi}\left[\frac{3(\vec{M}_S \vec{r}_{S1})\vec{r}_{S1}}{r_{S1}^5} - \frac{\vec{M}_S}{r_{S1}^3}\right] + \frac{\mu_0}{4\pi}\left[\frac{3(\vec{M}_I \vec{r}_{I1})\vec{r}_{I1}}{r_{I1}^5} - \frac{\vec{M}_I}{r_{I1}^3}\right] \quad (1)$$

where:

$\vec{B}\_mo1$ is the magnetic field produced by the source 10 and its image 66 which would be measured by the sensor 20 in the absence of the magnetic disturber 54, $\mu_0$ is the permeability of the vacuum, $\vec{M}_S$ is the magnetic moment of the source 10, $\vec{r}_{S1}$ is the distance between the center $O_s$ and the center $O_{c1}$ of the sensor 20, $\vec{M}_I$ is the magnetic moment of the image 66, $\vec{r}_{I1}$ is the distance between the center of the image 66 and the center of the sensor 20.

The distance $\vec{r}_{I1}$ is a function of the $x_I$, $y_I$ and $z_I$ coordinates of the image 66 in the reference system 6. In the particular case described herein where the magnetic moment $\vec{M}_S$ is perpendicular to the plane in which the disturber 54 essentially extends, the magnetic moment $\vec{M}_I$ is necessarily parallel to the magnetic moment $\vec{M}_S$ according to image theory in electromagnetism. Such an assumption is also true when the magnetic moment $\vec{M}_S$ is parallel to the plane in which the disturber 54 essentially extends. Further information on this image theory may be found in the following documents:

"Exact Image Theory for the Sommerfield Half-Space Problem, part I: Vertical Magnetic Dipole", I. Lindell, IEEE Transactions on Antennas and Propagation, Vol. AP-32, No. 2, February 1984, "Exact Image Theory for the Sommerfield Half-Space Problem, part III: General Formulation", I. Lindell, IEEE Transactions on Antennas and Propagation, Vol. AP-32, N° 10, October 1984.

The relationship (1) therefore has four unknowns, namely $x_I$, $y_I$ and $z_I$ as well as the amplitude of the magnetic moment $M_I$. Furthermore, the relationship which is expressed in vector form corresponds to three equations. Thus, to be able to determine the moment $M_I$ and the position of the image 66, an additional constraint must be dictated. In the particular case of FIG. 1, given that the dimensions of the disturber 54 are far greater than the distances $r_{s1}$ and $r_{s2}$ between the source 1 and the sensors 20 and 40 respectively, it is assumed here that the disturber 54 is an infinitely great conductive plane. Thus, according to image theory in electromagnetism, the distance between the image 66 and this infinitely great plane is equal to the distance between the source 10 and this same plane. Thus, we have a system of equations with three equations and three unknowns. Here, this system of equations is resolved by determining the position of the magnetic moment of the image 66 that minimizes the following criterion:

$$\text{Min}\{\vec{B}\_me1 - \vec{B}\_mo1\} \quad (2)$$

where:

$\vec{B}\_me1$ is the magnetic field measured by the sensor 20, and $\vec{B}\_mo1$ is the magnetic field emitted by the source 10 and its image 66 as defined by the relationship (1).

The search for the optimal solution that minimizes the criterion (2) is done by means of a known optimization routine such as the ones for example in the software application Matlab (RM).

Once the position and the magnetic moment of the image 66 are determined, the invention proceeds to a phase 70 for localizing the object 4 in the referential system 6.

This phase 70 starts with a step 72 during which the source 10 emits a magnetic field and the sensor 40 measures this emitted magnetic field. The measurements of the sensor 40 are acquired by the unit 42 and transmitted to the module 44 and to the compensator 46.

Then, at a step 74, the position of the object 4 is determined through the measurements in which compensation is achieved by the compensator 46. Here, the compensated measurement corresponds to the magnetic field measured by the sensor 40 minus the magnetic field generated by the image 66.

In this embodiment, since the position of the object 4 in the referential system 6 is unknown, the localizing of the object 4 and the compensation of the measurements of the sensor 40 are performed at the same time.

To this effect, during the step 74, the position of the sensor 40 that minimizes the following criterion is determined:

$$\text{Min}\{\vec{B}\_me2 - \vec{B}\_mo2\} \quad (3)$$

where:

$\vec{B}\_me2$ is the magnetic field measured by the sensor 40, and $\vec{B}\_mo2$ is the magnetic field emitted by the source 40 and its image 66 in the absence of the disturber 54.

According to the equations of electromagnetism, and using the dipole approximation, the magnetic field $\vec{B}\_mo2$ is given by the following relationship:

$$\vec{B}\_mo2 = \frac{\mu_0}{4\pi}\left[\frac{3(\vec{M}_S \vec{r}_{S2})\vec{r}_{S2}}{r_{S2}^5} - \frac{\vec{M}_S}{r_{S2}^3}\right] + \frac{\mu_0}{4\pi}\left[\frac{3(\vec{M}_I \vec{r}_{I2})\vec{r}_{I2}}{r_{I2}^5} - \frac{\vec{M}_I}{r_{I2}^3}\right] \quad (4)$$

where:

$r_{S2}$ is the distance between the center of the source 10 and the center of the sensor 40, and $r_{I2}$ is the distance between the center of the image 66 and the sensor 40.

These different distances have been shown in FIG. 1.

The second term of the relationship (4) corresponds to the magnetic fields emitted by the image 66 and measurable by the sensor 40. This second term is subtracted from the measurement of the field $\vec{B}\_me2$ in the criterion (3) so that it is truly the compensated measurement of the magnetic field that is used to localize the object 4.

At the step 74, the unknowns of the system of equations are the distances $r_{S2}$ and $r_{I2}$. Once this system of equations has been resolved, the position of the object 4 is known.

If necessary, after the phase 70, during a step 78, the compensated measurement of the magnetic field measured by the sensor 40 can be expressed by subtracting, from the magnetic field $\vec{B}\_me2$, the value of the magnetic field emitted at the same instant by the image 66.

Figure 5:
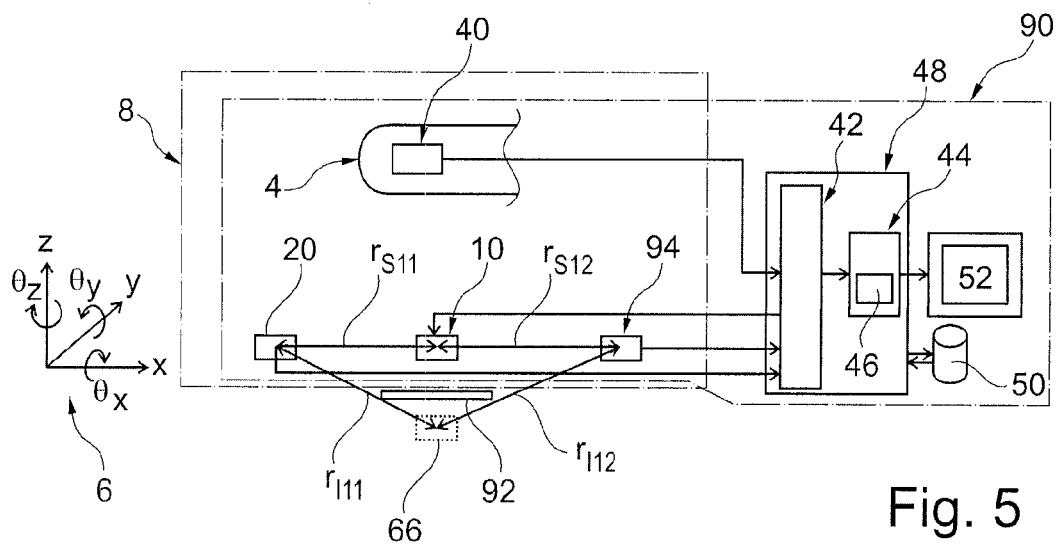
FIG. 5 is a schematic illustration of a second embodiment of a system for localizing an object.

FIG. 5 shows a system 90 for localizing the object 4 that can be used even when the magnetic disturber cannot be identified with an infinite conductive plane. For example, in this embodiment, the disturber 54 is replaced by a disturber 92 which is not highly conductive or whose size is not great enough for its upper plane face to be capable of being identified with an infinitely conductive plane. For example, in FIG. 5, the disturber 92 shown is too small to be identified with an infinite plane. Consequently, in this case, the number of unknowns of the system of equations is greater than the number of equations so that, at the step 64, it is not possible to measure the position of an image of the source with precision through the measurements of the sensor 20 alone. To resolve this problem, the system 90 is identical to the system 2 except that it additionally has a sensor 94 whose position relatively to the source 10 is known. For example, this sensor 94 is fixed relatively to the source 10.

The working of this system 90 is identical to that of the system 2 except that, during the step 64, the position and the magnetic moment of the image 66 are determined through measurements of the sensors 20 and 94. To this end, for example, the magnetic field generated by the source 10 and its image 66 in the absence of the disturber 92 is modelized by means of the following equations:

$$\vec{B}\_mo11 = \frac{\mu_0}{4\pi}\left[\frac{3(\vec{M}_S \vec{r}_{S11})\vec{r}_{S11}}{r_{S11}^5} - \frac{\vec{M}_S}{r_{S11}^3}\right] + \frac{\mu_0}{4\pi}\left[\frac{3(\vec{M}_I \vec{r}_{I11})\vec{r}_{I11}}{r_{I11}^5} - \frac{\vec{M}_I}{r_{I11}^3}\right] \quad (5)$$

$$\vec{B}\_mo12 = \frac{\mu_0}{4\pi}\left[\frac{3(\vec{M}_S \vec{r}_{S12})\vec{r}_{S12}}{r_{S12}^5} - \frac{\vec{M}_S}{r_{S12}^3}\right] + \frac{\mu_0}{4\pi}\left[\frac{3(\vec{M}_I \vec{r}_{I12})\vec{r}_{I12}}{r_{I12}^5} - \frac{\vec{M}_I}{r_{I12}^3}\right] \quad (6)$$

where:

$\vec{B}\_mo11$ is the magnetic field emitted by the source 10 and the image 66 which would be measured by the sensor 20 in the absence of the disturber 92, $\vec{B}\_mo12$ is the magnetic field emitted by the source 10 and its image 66 which will be measured by the sensor 94 in the absence of the disturber, $\vec{r}_{S11}$ and $\vec{r}_{S12}$ are the distances between the source 10 and the sensors 20 and 94 respectively, and $\vec{r}_{I11}$ and $\vec{r}_{I12}$ are the distances between the image 66 and the sensors 20 and 94 respectively.

Then the position of the image and the magnetic moment $\vec{M}_I$, of the image 66 are determined so as to minimize the following criteria:

$$\text{Min}\{\vec{B}\_me11 - \vec{B}\_mo11\} \quad (7)$$

$$\text{Min}\{\vec{B}\_me12 - \vec{B}\_mo12\} \quad (8)$$

where:

$\vec{B}\_me11$ and $\vec{B}\_me12$ are the measurements of the magnetic field made respectively by the sensors 20 and 94.

The system of equations to be resolved therefore comprises six equations and six unknowns. It is therefore possible to determine with precision the position of the image 66 which minimizes the above criteria (7) and (8).

Once this step has been terminated, the phase for localizing the object 4 in the referential system 6 takes place exactly as described with reference to FIG. 4.

Figure 6:
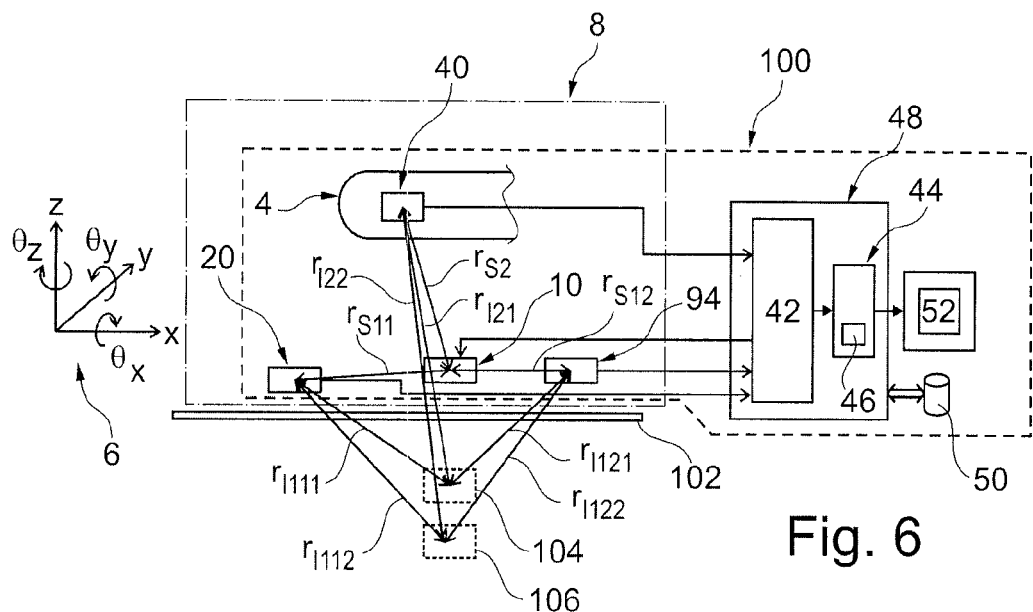
FIGS. 6 and 7 are schematic illustrations respectively of third and fourth embodiments of a system for localizing an object.

FIG. 6 represents a system 100 for localizing the object 4 especially adapted to the case where the measurements are disturbed by a magnetic disturber 102 that is highly conductive and permeable at the same time. For example, here the disturber 102 is a plate made out of magnetic stainless steel. The dimensions of this plate are for example identical to those of the plate 54 described with reference to FIG. 1.

To improve the compensation in the measurement in this case, two images of the source 10 are built. First of all, an image 104 here below called a "conductive image" which corresponds to the case in which the disturber 102 is replaced by a disturber of the same dimensions and made out of a material that has exactly the same conductivity but is impermeable. The term "impermeable" designates the fact that the relative permeability is equal to 1.

Another image 105 of the source 10, here below called a "magnetic image" is also built. This image 106 corresponds to the case where the disturber 102 is replaced by a magnetic disturber having exactly the same dimensions and made out of a material that has the same permeability but is non-conductive.

To simplify the FIG. 6, the images 104 and 106 are represented one on top of the other.

The system 100 is identical to the system 90 except that it has the instructions needed to compute the positions and magnetic moments of the images 104 and 106. To this end, the system 100 exploits the fact that a highly conductive and non-permeable disturber essentially disturbs the in-quadrature measurements of the magnetic field. Conversely, a permeable and non-conductive disturber disturbs essentially the in-phase measurements of the magnetic field.

The working of the system 100 is therefore identical to that described with reference to FIG. 4 except that, at the step 64, the position and the magnetic moments of the images 104 and 106 are determined by means of the following relationships:

$$\vec{B}\_mo11\_Q = \qquad (9)$$
$$\frac{\mu_0}{4\pi}\left[\frac{3(\vec{M}_S \vec{r}_{S11})\vec{r}_{S11}}{r_{S11}^5} - \frac{\vec{M}_S}{r_{S11}^3}\right] + \frac{\mu_0}{4\pi}\left[\frac{3(\vec{M}_{I1} \vec{r}_{I111})\vec{r}_{I111}}{r_{I111}^5} - \frac{\vec{M}_{I1}}{r_{I111}^3}\right]$$

$$\vec{B}\_mo11\_I = \qquad (10)$$
$$\frac{\mu_0}{4\pi}\left[\frac{3(\vec{M}_S \vec{r}_{S11})\vec{r}_{S11}}{r_{S11}^5} - \frac{\vec{M}_S}{r_{S11}^3}\right] + \frac{\mu_0}{4\pi}\left[\frac{3(\vec{M}_{I2} \vec{r}_{I112})\vec{r}_{I112}}{r_{I112}^5} - \frac{\vec{M}_{I2}}{r_{I112}^3}\right]$$

$$\vec{B}\_mo12\_Q = \qquad (11)$$
$$\frac{\mu_0}{4\pi}\left[\frac{3(\vec{M}_S \vec{r}_{S12})\vec{r}_{S12}}{r_{S12}^5} - \frac{\vec{M}_S}{r_{S12}^3}\right] + \frac{\mu_0}{4\pi}\left[\frac{3(\vec{M}_{I1} \vec{r}_{I121})\vec{r}_{I121}}{r_{I121}^5} - \frac{\vec{M}_{I1}}{r_{I121}^3}\right]$$

$$\vec{B}\_mo12\_I = \qquad (12)$$
$$\frac{\mu_0}{4\pi}\left[\frac{3(\vec{M}_S \vec{r}_{S12})\vec{r}_{S12}}{r_{S12}^5} - \frac{\vec{M}_S}{r_{S12}^3}\right] + \frac{\mu_0}{4\pi}\left[\frac{3(\vec{M}_{I2} \vec{r}_{I122})\vec{r}_{I122}}{r_{I122}^5} - \frac{\vec{M}_{I2}}{r_{I122}^3}\right]$$

where:

$\vec{B}\_mo11\_Q$ is the magnetic field in quadrature with the field emitted by the source 10 and the images 104 that would be measured by the sensor 20 in the absence of the disturber 102, $\vec{B}\_mo11\_I$ is the magnetic field in phase with the magnetic field emitted by the source 10 and the image 106 that would be measured by the sensor 20 in the absence of the disturber 102, $\vec{B}\_mo12\_Q$ is the magnetic field in quadrature emitted by the source 10 and the image 104 which would be measured by the sensor 94 in the absence of the disturber 102, $\vec{B}\_mo12\_I$ is the magnetic field in phase with the magnetic field emitted by the source 10 and the image 106 which would be measured by the sensor 94 in the absence of the disturber 102, $\vec{r}_{S11}, \vec{r}_{I111}, \vec{r}_{I112}$ are the distances between the sensor 20 and, respectively, the source 10 and the images 104 and 106, $\vec{M}_{I1}$ and $\vec{M}_{I2}$ are the magnetic moments respectively of the images 104 and 106, $\vec{r}_{S12}, \vec{r}_{I121}$ and $\vec{r}_{I122}$ are the distances between the sensor 94 and, respectively, the source 10 and the images 104 and 106.

At the step 64, the position and the magnetic moments of the images 104 and 106 are determined by searching for the minimum of the following criteria:

$$\text{Min}\{\vec{B}\_me11\_Q - \vec{B}\_mo11\_Q\} \qquad (13)$$

$$\text{Min}\{\vec{B}\_me11\_I - \vec{B}\_mo11\_I\} \qquad (14)$$

$$\text{Min}\{\vec{B}\_me12\_Q - \vec{B}\_mo12\_Q\} \qquad (15)$$

$$\text{Min}\{\vec{B}\_me12\_I - \vec{B}\_mo12\_I\} \qquad (16)$$

where:

$\vec{B}\_me11\_Q$ and $\vec{B}\_me11\_I$ are the measurements made by the sensor 20, respectively in quadrature and in phase, of the magnetic field emitted by the source 10 in the presence of the disturber 102, and $\vec{B}\_me12\_Q$ and $\vec{B}\_me12\_I$ are the measurements made by the sensor 94, respectively in quadrature and in phase, of the magnetic field emitted by the source 10 in the presence of the disturber 102.

The previous equations correspond to a system with 12 equations and eight unknowns, making it possible therefore to precisely determine the positions and the magnetic moments of the images 104 and 106.

Then, during the localization phase and more specifically during the step 74, the position of the object 4 is determined by means of the following relationship (17):

$$\vec{B}\_mo2 = \frac{\mu_0}{4\pi}\left[\frac{3(\vec{M}_S \vec{r}_{S2})\vec{r}_{S2}}{r_{S2}^5} - \frac{\vec{M}_S}{r_{S2}^3}\right] +$$
$$\frac{\mu_0}{4\pi}\left[\frac{3(\vec{M}_{I1} \vec{r}_{I21})\vec{r}_{I21}}{r_{I21}^5} - \frac{\vec{M}_{I1}}{r_{I21}^3}\right] + \frac{\mu_0}{4\pi}\left[\frac{3(\vec{M}_{I2} \vec{r}_{I22})\vec{r}_{I22}}{r_{I22}^5} - \frac{\vec{M}_{I2}}{r_{I22}^3}\right]$$

where:

$\vec{B}\_mo2$ is the magnetic field emitted by the source 10 and the images 104 and 106 which would be measured by the sensor 40 in the absence of the magnetic disturber 102, $\vec{r}_{S2}, \vec{r}_{I21}$ and $\vec{r}_{I22}$ are the distances between the sensor 40, respectively, and the source 10 and the images 104 and 106.

The position of the sensor 40 is then measured during the step 74 by finding the minimum of the following criterion:

$$\text{Min}\{\vec{B}\_me2 - \vec{B}\_mo2\} \qquad (18)$$

where $\vec{B}\_me2$ is the magnetic field measured by the sensor 40 in the presence of the magnetic disturber 102.

This criterion (18) corresponds to a system with three equations and three unknowns i.e. the distances $r_{s2}$, $r_{121}$ and $r_{122}$. The minimum of this relationship gives the position of the sensor 40 in the referential system 6.

Figure 7:
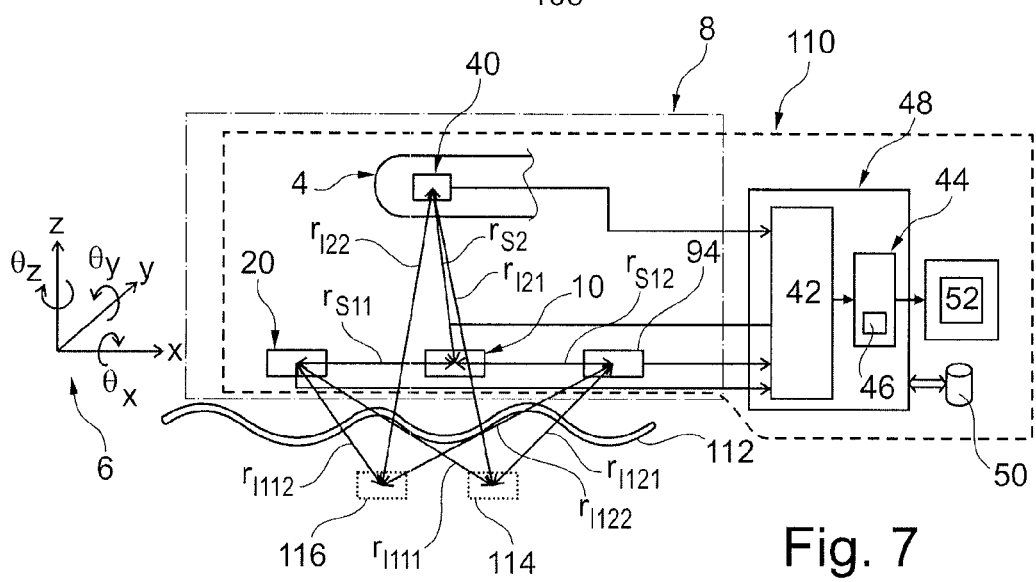

FIG. 7 represents another system 110 for localizing the object 4 especially adapted to the case in which the measurements of the magnetic fields are disturbed by a magnetic disturber 112 having magnetic properties or which have a shape more distant from those used in image theory. In this case, the system 110 has instructions such that several images of the source 10 relatively to the disturber 112 are built. For example, here, two images of the source 10, respectively 114 and 116 are used. To this end, the system 110 is identical to the system 90 except that it has instructions to determine the positions and the magnetic moments of the images 114 and 116.

More specifically, the working of the system 110 is identical to that of the system 90 except that the steps 64 and 74 are suited firstly to determining the positions and the magnetic moments of the images 114 and 116 and secondly to using the magnetic field emitted by these images 114 and 116 to compensate in the measurements of the sensor 40.

For example, at the step 64, the following relationships are used:

$$\vec{B}\_mo11 = \frac{\mu_0}{4\pi}\left[\frac{3(\vec{M}_S \vec{r}_{S11})\vec{r}_{S11}}{r_{S11}^5} - \frac{\vec{M}_S}{r_{S11}^3}\right] + \frac{\mu_0}{4\pi}\left[\frac{3(\vec{M}_{I1}\vec{r}_{I111})\vec{r}_{I111}}{r_{I111}^5} - \frac{\vec{M}_{I1}}{r_{I111}^3}\right] \quad (19)$$

$$\vec{B}\_mo12 = \frac{\mu_0}{4\pi}\left[\frac{3(\vec{M}_S \vec{r}_{S12})\vec{r}_{S12}}{r_{S12}^5} - \frac{\vec{M}_S}{r_{S12}^3}\right] + \frac{\mu_0}{4\pi}\left[\frac{3(\vec{M}_{I2}\vec{r}_{I121})\vec{r}_{I121}}{r_{I122}^5} - \frac{\vec{M}_{I2}}{r_{I122}^3}\right] \quad (20)$$

where:

$\vec{B}\_mo11$ is the magnetic field emitted by the source 10 and the image 114 and measurable by the sensor 20, $\vec{B}\_mo12$ is the magnetic field emitted by the source 10 and the image 116 and measurable by the sensor 94 in the absence of the disturber 112, $\vec{r}_{S11}$ and $\vec{r}_{I111}$ are the distances between the sensor 20 and, respectively, the source 10 and the image 114, $\vec{r}_{S12}$ and $\vec{r}_{I112}$ are the distances between the sensor 94 and respectively the source 10 and the image 116, and $\vec{M}_{I1}$ and $\vec{M}_{I2}$ are the moments respectively of the images 114 and 116.

Then, the position and the magnetic moments of the images 114 and 116 are determined by finding the optimum of the following criteria:

$$\text{Min}\{\vec{B}\_me11 - \vec{B}\_mo11\} \quad (21)$$

$$\text{Min}\{\vec{B}\_me12 - \vec{B}\_mo12\} \quad (22)$$

where:

$\vec{B}\_me11$ and $\vec{B}\_me12$ are the measurements of the magnetic field emitted by the source 10, obtained respectively by the sensors 20 and 94.

These criteria (21) and (22) correspond to a system with six equations and eight unknowns. Thus, to find a minimum, two additional constraints are imposed on the position or the magnetic moment of the images 114 and 116. These additional constraints are derived from image theory in electromagnetism. For example, in this case, it is assumed that the conductivity σ and the permeability $\mu_r$ of the disturber 112 are known. Thus, the magnetic moments $\vec{M}_{I1}$ and $\vec{M}_{I2}$ can be computed through the following relationship:

$$M_i = M_S\left(\frac{1-\mu_r}{1+\mu_r}\right)\left(\frac{1-\sigma}{1+\sigma}\right) \quad (24)$$

where $M_i$ is the magnetic moment of the image 114 or 116.

Then, at the step 74, the position of the sensor 40 is determined by means of the following equation (23):

$$\vec{B}\_mo2 = \frac{\mu_0}{4\pi}\left[\frac{3(\vec{M}_S \vec{r}_{S2})\vec{r}_{S2}}{r_{S2}^5} - \frac{\vec{M}_S}{r_{S2}^3}\right] + \frac{\mu_0}{4\pi}\left[\frac{3(\vec{M}_{I1}\vec{r}_{I21})\vec{r}_{I21}}{r_{I21}^5} - \frac{\vec{M}_{I1}}{r_{I21}^3}\right] + \frac{\mu_0}{4\pi}\left[\frac{3(\vec{M}_{I2}\vec{r}_{I22})\vec{r}_{I22}}{r_{I22}^5} - \frac{\vec{M}_{I2}}{r_{I22}^3}\right]$$

where:

$r_{S2}$, $r_{I21}$ and $r_{I22}$ are the distances between the sensor 40 respectively and the source 10 of the image 114 and the image 116, and $\vec{B}\_mo2$ is the magnetic field emitted by the source 10 and the images 114 and measurable by the sensor 40 in the absence of the magnetic disturber 112.

The position of the sensor 40 is then determined by finding the minimum of the following criterion:

$$\text{Min}\{\vec{B}\_me2 - \vec{B}\_mo2\} \quad (25)$$

where $\vec{B}\_me2$ is the magnetic field measured by the sensor 40 in the presence of the disturber 112.

The above criterion corresponds to a system with three equations and three unknowns which therefore makes it possible to obtain the position of the sensor 40 in the reference system 6.

Many other embodiments are possible. For example, it is not necessary for the source 10 to be fixed in the referential system 6. As a variant, the source 10 can be shifted in a known way in the referential system 6.

Nor is it necessary for the sensor 20 and the sensor 40 to be two distinct magnetic sensors. For example, as a variant, the sensor 20 is positioned at a known predetermined location during the calibration phase and then fixed to the object 4 during the phase for localizing this object.

The number of sensors and/or the number of axes of measurement of these sensors can be modified. In all cases, this number must be sufficient to enable the precise determining of the position and of the magnetic moment of at least one image of the source and the localizing of the object 4.

To determine the position of the images of the source 10, other constraints derived from image theory in electromagnetism can be used to restrict the number of sensors or the number of axes of the sensors used. For example, if the conductivity σ and the relative permeability $\mu_r$ of the disturber are known, then the following relationship can be used:

$$M_i = M_S\left(\frac{1-\mu_r}{1+\mu_r}\right)\left(\frac{1-\sigma}{1+\sigma}\right) \quad (26)$$

where Mi is the magnetic moment of the image.

Should the disturber be uniquely permeable or uniquely conductive, then the law of conservation of the normal component of the magnetic field at the crossing of the plane face of the disturber makes it possible to determine the orientation of the moment of the source of the image.

The number of axes of the source 10 or of the sensors can be modified. However, this number of axes must remain sufficient to enable the determining of the position and the magnetic moment of the image as well as the localizing of the object 4.

Here, the system of localization especially of compensation in the measurement has been described in the case where the magnetic field that would be measured in the absence of the magnetic disturber is computed by the equations of electromagnetism. However, in another variant, this magnetic field is measured. To this end, the magnetic field of the source 10 is measured by the sensor 20 and/or the sensor 94 in the absence of the magnetic disturber. Then, the position and the magnetic moment of the image of the source 10 relatively to this magnetic disturber are computed so that the magnetic field produced by this image minimizes the following relationship:

$$\vec{B}_{me} - \vec{B}_S - \vec{B}_I \qquad (27)$$

where:

$\vec{B}_{me}$ and $\vec{B}_S$ are the magnetic fields measured respectively in the presence and absence of the magnetic disturber, and the field $\vec{B}_I$ is the magnetic field generated by the image of the probe 10 whose position and magnetic moment have to be determined.

The system 100 makes use of the theory according to which:

a highly conductive and non-permeable disturber disturbs essentially the measurements in quadrature of the magnetic field, and a permeable and non-conductive disturber disturbs essentially the measurements in phase of the magnetic field.

It turns out in reality that this theory is not perfect. In this case, to improve the compensation, it is possible to focus on the effective modulus of the magnetic field. The effective modulus A of the magnetic field is defined by the following relationship:

$$A = \sqrt{I^2 + Q^2}, \text{ where:}$$

A is the effective modulus of the magnetic field measured,
I is the amplitude of the magnetic field measured in phase with the magnetic field emitted by the source 10, and
Q is the amplitude of the magnetic field measured in quadrature with the magnetic field emitted by the source 10.

In this case, the working of the system 100 is identical to the one described with respect to FIG. 6 except that, at the step 64, the effective moduli A_mo11 and A_mo12 are computed, for example by means of the following relationships:

$$A\_mo11 = \sqrt{B\_mo11\_Q^2 + B\_mo11\_I^2} \qquad (28)$$

$$A\_mo12 = \sqrt{B\_mo12\_Q^2 + B\_mo12\_I^2} \qquad (29)$$

where:

A_mo11 and A_mo12 are the effective moduli of the magnetic field emitted by the source 10 and the images 104 and 106 that would be measured respectively by the sensors 20 and 94 in the absence of the disturber 102, B_mo11_Q and B_mo12_Q are the amplitudes of the magnetic field in quadrature emitted by the source 10 and the images 104 and 106 that would be measured by the sensor 20 in the absence of the disturber 102, and B_mo11_I and B_mo12_I are the amplitudes of the magnetic field in phase emitted by the source 10 and the images 104 and 106 that would be measured by the sensor 94 in the absence of the disturber 102.

For example, the amplitudes B_mo11_Q, B_mo11_I, B_mo12_Q and B_mo12_I are determined from the relationships (9) to (12) described here above.

The position of the images 104 and 106 is then determined by minimizing the following criteria:

$$\text{Min}\{A\_me11 - A\_mo11\} \qquad (30)$$

$$\text{Min}\{A\_me12 - A\_mo12\} \qquad (31)$$

where A_me11 and A_me12 are the effective moduli of the magnetic fields measured respectively by the sensors 20 and 94.

To increase the number of equations and enable a more precise determining of the positions and magnetic moments of the images 104 and 106, it is also possible to use the following two relationships:

$$M_{I1} = M_S\left(\frac{1-\mu_r}{1+\mu_r}\right) \qquad (30)$$

$$M_{I2} = M_S\left(\frac{1-\sigma}{1+\sigma}\right) \qquad (31)$$

The conductivity $\sigma$ and the permeability $\mu_r$ of the disturber 102 may be known or unknown. In the latter case, they will be determined.

The effective modulus may also be used to determine the position and the magnetic moment of a single image of the source 10. In this case, the relationships given here above are simplified.

If it is not necessary to use the effective modulus of the magnetic field to determine the position of one or more images and if the magnetic disturber is conductive and non-permeable, then it is possible to use only the measurements in quadrature of the magnetic field instead of the effective amplitude of this magnetic field. Conversely, if the magnetic disturber is solely permeable and non-conductive, then it is possible to use only the measurements in phase of the magnetic field instead of the effective amplitude of this magnetic field.

Compensation in measurement has been described here in the particular case where the compensated measurement is used to improve the precision of the localization of an object. However, as a variant, the method of compensation is used in other applications. For example, the method of compensation described can be used to provide compensation in the measurement of a sensor whose position is known. For example, in this case, at the step 74, it is the magnetic moments $M_s$ and $M_i$ that are the unknown quantities while the different distances between the probe and the image of this probe of the sensor are known.

The invention claimed is:

1. A method of compensating a measurement of a magnetic field, the method comprising:

emitting a magnetic field in the presence of a magnetic disturber, by means of a uniaxial source, situated on one side of the magnetic disturber, the magnetic moment of the source being known, determining a position and a magnetic moment of an image of the source situated on the other side of the magnetic disturber using one or more measurements of the emitted magnetic field, the measurements being performed by at least one magnetic sensor whose position and orientation relative to the source are known, the position and the magnetic moment of the image minimizing the following relationship for each sensor:

$$\vec{B}_{me} - (\vec{B}_S + \vec{B}_I),$$

where:

$\vec{B}_{me}$ is a magnetic field measured by the sensor in the presence of the magnetic disturber, $\vec{B}_S$ is a magnetic field that would be measured by the sensor in the absence of the magnetic disturber, and $\vec{B}_I$ is a fictitious magnetic field emitted by the image that would be measured by the sensor in the absence of the magnetic disturber, subtracting the magnetic field emitted by the image, constructed from the position and the magnetic moment of the image, from the measurement of the magnetic field made by the sensor in the presence of the magnetic disturber to compensate the measurement, determining the position and magnetic moment of several images of the same source from the same measurements of the magnetic field, the measurements being performed by several sensors whose positions and orientations are known relative to the source, and subtracting the magnetic field emitted by the images from the measurement of the magnetic field performed by a sensor in the presence of the magnetic disturber, thereby compensating for the measurement.

2. The method of claim 1, wherein determining the position and the magnetic moment of the image comprises using at least one supplementary relationship derived from electromagnetic image theory, the at least one supplementary relationship being chosen from the following set:

$$M_i = M_S\left(\frac{1-\mu_r}{1+\mu_r}\right)\left(\frac{1-\sigma}{1+\sigma}\right),$$

$$M_i = M_S\left(\frac{1-\mu_r}{1+\mu_r}\right), \text{ and}$$

$$M_i = M_S\left(\frac{1-\sigma}{1+\sigma}\right),$$

where:
$M_i$ and $M_S$ are magnetic moments of the image and of the source respectively, and
$\sigma$ and $\mu_r$ are the conductivity and relative permeability of the magnetic disturber respectively, wherein the shortest distance between the source and the magnetic disturber is equal to the shortest distance between the image of the source and the magnetic disturber, and wherein a normal component of the magnetic field at the crossing of one face of the magnetic disturber is kept on either side of the face.

3. The method of claim 1, further comprising:
determining the position and the magnetic moment of an image of the source solely from the measurements of a magnetic field in quadrature relative to the magnetic field emitted by the source, the measurement being performed by the sensor or sensors whose position and orientation relative to the source are known, and
determining the position and the moment of an other image of the same source solely from the measurements of the magnetic field in phase with the magnetic field emitted by the source, the measurement being performed by the sensor or sensors whose position and orientation relative to the source are known.

4. The method of claim 1, further comprising
computing an effective modulus of the magnetic field from measurements thereof, in phase and in quadrature relative to the magnetic field emitted by the source, the measurements being performed by the sensor or sensors whose position and orientation relative to the source are known;
determining the position and the magnetic moment of at least one image of the source from the modulus of the magnetic field.

5. The method of claim 1, further comprising modeling each image of the source as a magnetic dipole.

6. A method for localizing an object, the method comprising:
emitting, in the presence of a magnetic disturber, a magnetic field provided by a uniaxial source situated on one side of the magnetic disturber, the magnetic moment of the source being known,
measuring a magnetic field emitted by a fixed sensor without any degree of freedom for the object,
localizing the object relative to the source by means of the measurement of the sensor,
during the localization, compensating the measurement of the sensor;
wherein compensating comprises determining a position and a magnetic moment of an image of the source situated on the other side of the magnetic disturber using one or more measurements of the emitted magnetic field, the measurements being performed by at least one magnetic sensor whose position and orientation relative to the source are known, the position and magnetic moment of the image minimizing the following relationship for each sensor:

$$\vec{B}_{me} - (\vec{B}_S + \vec{B}_I),$$

where:
$\vec{B}_{me}$ is the magnetic field measured by the sensor in the presence of the magnetic disturber,
$\vec{B}_S$ is the magnetic field that would be measured by the sensor in the absence of the magnetic disturber, and
$\vec{B}_I$ is the fictitious magnetic field emitted by the image that would be measured by the sensor in the absence of the magnetic disturber, and subtracting the magnetic field emitted by the image, constructed from the position and the magnetic moment of the image, from the measurement of the magnetic field made by the sensor in the presence of the magnetic disturber to compensation in the measurement, determining the position and magnetic moment of several images of the same source from the same measurements of the magnetic field, the measurements being performed by several sensors whose positions and orientations are known relative to the source, and subtracting the magnetic field emitted by the images from the measurement of the magnetic field performed by a sensor in the presence of the magnetic disturber, thereby compensating for the measurement.

7. The method of claim 6, wherein localizing comprises determining distances from the object to be localized to its source and to its image or images.

8. A tangible and non-transitory information-recording medium comprising instructions that, when executed by an electronic digital computer, cause the following compensation method:
emitting a magnetic field in the presence of a magnetic disturber, by means of a uniaxial source situated on one side of the magnetic disturber, the magnetic moment of the source being known,
determining a position and a magnetic moment of an image of the source situated on the other side of the magnetic disturber using one or more measurements of the emitted magnetic field, the measurements being performed by at least one magnetic sensor whose position and orientation relative to the source are known, the position and the magnetic moment of the image minimizing the following relationship for each sensor:

$$\vec{B}_{me} - (\vec{B}_S + \vec{B}_I),$$

where:

$\vec{B}_{me}$ is the magnetic field measured by the sensor in the presence of the magnetic disturber, $\vec{B}_S$ is the magnetic field that would be measured by the sensor in the absence of the magnetic disturber, and $\vec{B}_I$ is the fictitious magnetic field emitted by the image that would be measured by the sensor in the absence of the magnetic disturber, and subtracting the magnetic field emitted by the image, constructed from the position and the magnetic moment of the image, from the measurement of the magnetic field made by the sensor in the presence of the magnetic disturber to compensate the measurement, determining the position and magnetic moment of several images of the same source from the same measurements of the magnetic field, the measurements being performed by several sensors whose positions and orientations are known relative to the source, and subtracting the magnetic field emitted by the images from the measurement of the magnetic field performed by a sensor in the presence of the magnetic disturber, thereby compensating for the measurement.

9. An apparatus for compensation of a measurement of a magnetic field, the apparatus comprising:

a uniaxial source situated on one side of a magnetic disturber, the source being capable of emitting a magnetic field in the presence of the magnetic disturber, the magnetic moment of the source being known, at least one sensor of the magnetic field, the sensor having a known position and orientation relative to the magnetic source, a compensator capable of:

determining a position and magnetic moment of an image of the source situated on the other side of the magnetic disturber through one or more measurements of the magnetic field emitted by the source, the one or more measurements being performed by the sensor or sensors, wherein the position of the magnetic moment of the image minimizes the following relationship for each sensor:

$$\vec{B}_{me} - (\vec{B}_S + \vec{B}_I),$$

where:

$\vec{B}_{me}$ is the magnetic field measured by the sensor in the presence of the magnetic disturber, $\vec{B}_S$ is the magnetic field that would be measured by the sensor in the absence of the magnetic disturber, and $\vec{B}_I$ is the fictitious magnetic field emitted by the image that would be measured by the sensor in the absence of the magnetic disturber, subtracting the magnetic field emitted by the image, built from the position and the magnetic moment of the image, from the measurement of the magnetic field made by the sensor, thereby achieving compensation in the measurement, determining the position and magnetic moment of several images of the same source from the same measurements of the magnetic field, the measurements being performed by several sensors whose positions and orientations are known relative to the source, and subtracting the magnetic field emitted by the images from the measurement of the magnetic field performed by a sensor in the presence of the magnetic disturber, thereby compensating for the measurement.

10. A system for localizing an object, the system comprising:

at least one uniaxial source situated on one side of a magnetic disturber, the source being capable of emitting a magnetic field in the presence of the magnetic disturber, the magnetic moment of the source being known, at least one sensor of the magnetic field emitted by the source, the sensor being fixed without any degree of freedom to the object to be localized, and a module for localizing the position of the sensor relative to the source through the measurement of the sensor, and an apparatus as recited in claim 9 for compensation in the measurement used by the localization module.

11. A method for localizing an object, the method comprising:

emitting, in the presence of a magnetic disturber, a magnetic field provided by a uniaxial source situated on one side of the magnetic disturber, the magnetic moment of the source being known, measuring a magnetic field emitted by a fixed sensor without any degree of freedom for the object, localizing the object relative to the source by means of the measurement of the sensor, during the localization, compensating the measurement of the sensor;

wherein localizing comprises determining distances from the object to be localized to its source and to its image or images, wherein compensating the measurement comprises emitting a magnetic field in the presence of a magnetic disturber, by means of a uniaxial source situated on one side of a magnetic disturber, a magnetic moment of a source being known, determining a position and a magnetic moment of an image of the source situated on the other side of the magnetic disturber using one or more measurements of the emitted magnetic field, the measurements being performed by at least one magnetic sensor whose position and orientation relative to the source are known, the position and the magnetic moment of the image minimizing the following relationship for each sensor:

$$\vec{B}_{me} - (\vec{B}_S + \vec{B}_I),$$

where:

$\vec{B}_{me}$ is the magnetic field measured by the sensor in the presence of the magnetic disturber, $\vec{B}_S$ is the magnetic field that would be measured by the sensor in the absence of the magnetic disturber, and $\vec{B}_I$ is the fictitious magnetic field emitted by the image that would be measured by the sensor in the absence of the magnetic disturber, and subtracting the magnetic field emitted by the image, constructed from the position and the magnetic moment of the image, from the measurement of the magnetic field made by the sensor, in the presence of the magnetic disturber to compensate in the measurement, determining the position and magnetic moment of several images of the same source from the same measurements of the magnetic field, the measurements being performed by several sensors whose positions and orientations are known relative to the source, and subtracting the magnetic field emitted by the images from the measurement of the magnetic field performed by a sensor in the presence of the magnetic disturber, thereby compensating for the measurement.

* * * * *